United States Patent
Park et al.

(10) Patent No.: US 7,411,240 B2
(45) Date of Patent: *Aug. 12, 2008

(54) INTEGRATED CIRCUITS INCLUDING SPACERS THAT EXTEND BENEATH A CONDUCTIVE LINE

(75) Inventors: Sung-Joon Park, Gyeonggi-do (KR); Seong-Goo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 195 days.

This patent is subject to a terminal disclaimer.

(21) Appl. No.: 11/170,820

(22) Filed: Jun. 30, 2005

(65) Prior Publication Data

US 2005/0239279 A1    Oct. 27, 2005

Related U.S. Application Data

(63) Continuation of application No. 10/631,595, filed on Jul. 31, 2003, now Pat. No. 6,930,341.

(30) Foreign Application Priority Data

Aug. 2, 2002    (KR) .............................. 2002-0045915

(51) Int. Cl.
*H01L 21/8242* (2006.01)

(52) U.S. Cl. .................. 257/306; 257/296; 257/369; 257/E21.507; 257/E21.578; 438/254; 438/618

(58) Field of Classification Search .................. 257/296, 257/306, 369; 438/254, 618
See application file for complete search history.

(56) References Cited

U.S. PATENT DOCUMENTS

| 6,353,249 B1 * | 3/2002 | Boyd et al. .................. 257/369 |
| 6,403,996 B1 * | 6/2002 | Lee ............................ 257/256 |
| 6,511,879 B1 | 1/2003 | Drynan |
| 6,642,581 B2 | 11/2003 | Matsuda et al. |
| 6,930,341 B2 * | 8/2005 | Park et al. .................... 257/296 |

* cited by examiner

*Primary Examiner*—Dao H. Nguyen
(74) *Attorney, Agent, or Firm*—Myers Bigel Sibley & Sajovec, PA

(57) ABSTRACT

Integrated circuit devices are fabricated by fabricating a conductive line on an insulating layer on an integrated circuit substrate. The conductive line includes a bottom adjacent the insulating layer, a top remote from the insulating layer and first and second sidewalls therebetween. An insulating spacer is formed to extend along the first and second sidewalls and to also extend along at least a portion of the bottom between the conductive line and the insulating layer. By providing an insulating spacer beneath at least a portion of the conductive line, insulation reliability may be improved even as the spacer may become narrower and/or the contact area may be enlarged.

13 Claims, 14 Drawing Sheets

INTEGRATED CIRCUITS INCLUDING SPACERS THAT EXTEND BENEATH A CONDUCTIVE LINE

RELATED APPLICATIONS

This application is a continuation of application Ser. No. 10/631,595 filed Jul. 31, 2003, now U.S. Pat. No. 6,930,341 entitled Integrated Circuits Including Insulating Spacers That Extend Beneath a Conductive Line, which itself claims priority under 35 U.S.C. § 119 from Korean Patent Application No. 2002-0045915, filed Aug. 2, 2002, the disclosures of which are hereby incorporated herein by reference in their entirety as if set forth fully herein.

FIELD OF THE INVENTION

The present invention relates to integrated circuit devices and methods for forming the same, and more particularly, to integrated circuit devices with conductive lines and methods for forming the same.

BACKGROUND OF THE INVENTION

Integrated circuit devices are widely used in consumer and commercial applications. As integrated circuit devices become more highly integrated, the reliability of insulation between conductive line interconnections may impact the reliability of the devices. An example of a conductive line is a bit line in an integrated circuit memory device.

FIG. 1 is a plan view of an integrated circuit memory device with a bit line in a conventional capacitor over bit line (COB) structure. FIGS. 2A to 2E are cross-sectional views of the device for illustrating a method for manufacturing the device shown in FIG. 1, wherein the cross-sectional views are taken along a line II-II in FIG. 1. FIGS. 3A to 3E are cross-sectional views of the device for illustrating the method for manufacturing the device shown in FIG. 1, wherein the cross-sectional views are taken along a line III-III in FIG. 1. FIG. 4 is a cross-sectional view of the device, taken along a line IV-IV in FIG. 1.

Referring to FIG. 2A and FIG. 3A, there is provided an integrated circuit substrate such as a semiconductor substrate 100 having an active region 101 and a field region. A shallow trench isolation (STI) film 105 is formed in the field region of the substrate 100 by a known STI method.

A gate 110, a first interlayer insulation layer 120 and a contact pad 130 are formed on the substrate 100. The contact pads 130 are connected to impurity regions (not shown) of a predetermined conductivity type formed in the active regions 101 through contacts 125, respectively. As shown in FIG. 4, the gate 110 comprises a gate oxide layer 111, a gate electrode material layer 113, a gate capping layer 115 stacked in order, and a sidewall spacer 127.

A second interlayer insulation layer 140 is formed on the first interlayer insulation layer 120 and then etched to form a contact hole 145 exposing corresponding ones of contact pads 130 which are to be connected to a conductive line such as a bit line in the following process.

A barrier metal layer 151 and a metal layer 155 for a bit line contact pad are sequentially formed on the substrate 100 including the bit line contact hole 145 and then etched using a chemical mechanical polishing (CMP) process to form a bit line contact pad 150 comprised of the barrier metal layer 151 and the metal layer 155 in the bit line contact hole 145.

Referring to FIG. 2B and FIG. 3B, a barrier metal layer 161, a conductive material layer 163 for a bit line and a bit line capping layer 165 are formed on the second interlayer insulation layer 140 and then patterned to form a bit line 160. The bit line 160 includes the barrier metal layer 161, the conductive material layer 163 and the bit line capping layer 165 and is connected to the bit line contact pad 150 through the bit line contact hole 145.

Referring to FIG. 2C and FIG. 3C, an insulation layer such as a nitride layer is formed on the bit line 160 and the second interlayer insulation layer 140, and etched back to form a bit line spacer 170. In more detail, the capping layer 165 is formed on the upper layer of the bit line 160 and the bit line spacer 170 is formed at a sidewall of the bit line 160. Accordingly, the bit line 160 is surrounded by the insulation material on its upper surface and sidewalls to provide isolation.

Referring to FIG. 2D and FIG. 3D, a third interlayer insulation layer 180 is formed on the second interlayer insulation layer 140 and the bit line 160. Then the second and third interlayer insulation layers 140 and 180 are etched to form a storage node contact hole 185 exposing corresponding one of contact pads 130 which is to be connected to a storage node of a capacitor in the following process.

Referring to FIG. 2E and FIG. 3E, a polysilicon layer is formed on the third interlayer insulation layer 180 to be filled with the storage node contact hole 185, and then etched using a known CMP process for a node separation to form a storage node contact pad 190. The storage node contact pad 190 is connected to the exposed one of the contact pads 130 via the storage node contact hole 185. Next, a capacitor (not shown) is formed to connect to the storage node 190 by a conventional capacitor formation process, thereby fabricating the device.

As described above, the bit line is insulated from the storage node contact pad by forming the bit line spacer on the sidewall thereof. However, the width of the bit line spacer may become narrower as the devices become more highly integrated. Accordingly, it may be difficult to provide electrical insulation reliability between the bit line and the adjacent storage node contact pad.

Furthermore, it may be desired to reduce contact resistance of the storage node contact pad in order to provide high performance devices. To decrease the contact resistance, the contact area of the storage node contact pad may be enlarged. However, if the contact area is increased, the insulation reliability may be lowered. Accordingly, it may be difficult to decrease the contact resistance of the storage node contact pad without deteriorating the insulation reliability.

SUMMARY OF THE INVENTION

Some embodiments of the present invention provide an integrated circuit device that includes an integrated circuit substrate, an insulation layer or the integrated circuit substrate, and a conductive line on the insulation layer. The conductive line includes a bottom adjacent the insulation layer, a top remote from the insulation layer and first and second sidewalls therebetween. A spacer extends along the first and second sidewalls, and also extends along at least a portion of the bottom between the conductive line and the insulation layer. By providing a spacer beneath at least a portion of the conductive line, insulation reliability may be improved even as the spacer may become narrower and/or the contact area may be enlarged.

In other embodiments of the invention, the insulation layer includes therein a first trench that extends beneath the bottom adjacent the first sidewall to define a first trench sidewall, and a second trench that extends beneath the bottom adjacent the second sidewall to define a second trench sidewall. In these embodiments, the spacer extends from the first sidewall into the first trench to the first trench sidewall, and also extends from the second sidewall into the second trench to the second trench sidewall. A contact pad may be provided on the spacer, remote from the conductive line.

In accordance with other embodiments of the present invention, integrated circuit devices comprise an integrated circuit substrate, an insulation layer on the substrate and including a contact hole, a contact pad in the contact hole, a conductive line such as a bit line on the insulation layer and connected to the contact pad, and a spacer on the conductive line. The insulation layer further includes a trench exposing a bottom surface of the conductive line, and the spacer is on a sidewall of the conductive line and on a sidewall of the trench to cover an exposed bottom surface of the conductive line.

In accordance with other embodiments of the present invention, integrated circuit devices comprise a first insulation layer on a substrate and including a plurality of first contact holes, a plurality of conductive lines in the first contact holes and on the first insulation layer and spaced apart from each other and a plurality of spacers, a respective one of which is on a respective sidewall of a conductive line. A second insulation layer is on the conductive lines and the first insulation layer. A second contact hole is in the first and second insulation layers, and a second contact pad is in the second contact hole. The first insulation layer further includes a plurality of trenches exposing bottom surfaces of the conductive lines, and a respective spacer is formed on a respective sidewall of a conductive line and on a respective sidewall of the trench adjacent thereto, to cover an exposed bottom surface of the conductive line.

Integrated circuit devices are fabricated, according to some embodiments of the present invention, by fabricating a conductive line on an insulation layer on an integrated circuit substrate. The conductive line includes a bottom adjacent the insulation layer, a top remote from the insulation layer and first and second sidewalls therebetween. A spacer is formed to extend along the first and second sidewalls and to also extend along at least a portion of the bottom between the conductive line and the insulation layer.

In some embodiments, prior to forming the spacer, a first trench is formed in the insulation layer that extends beneath the bottom adjacent the first sidewall to define a first trench sidewall. A second trench is also formed in the insulation layer that extends beneath the bottom adjacent the second sidewall to define a second trench sidewall. Then, the spacer is formed to extend from the first sidewall into the first trench to the first trench sidewall, and to also extend from the second sidewall into the second trench to the second trench sidewall. In some embodiments, the first and second trenches are formed by overetching the insulation layer using the conductive line as an etch mask to undercut the bottom.

In accordance with other embodiments of the present invention, an integrated circuit device is fabricated by forming a first insulation layer on a substrate, including thereon a plurality of conductive line contact holes, and forming a plurality of conductive lines on the conductive line contact holes and the first insulation layer, and spaced apart from each other. The first insulation layer is etched to form a plurality of trenches exposing bottom surfaces of the conductive lines. A plurality of spacers are formed to cover exposed bottom surfaces of the conductive lines and sidewalls of the conductive lines. A second insulation layer is formed on the substrate. The first and second insulation layers are etched to form a second contact hole. A second contact pad is formed in the second contact hole.

In some embodiments, the first and second insulation layers are formed of (i.e., comprise) an oxide layer such as a TOSZ oxide layer, a high density oxide layer or a BPSG layer. The spacer is formed of an insulation material having etching selectivity to the first and second insulation layers such as a nitride layer and/or an oxide layer.

In some embodiments, the trench in the first insulation layer is formed between adjacent conductive lines to have a width greater than a distance between the adjacent conductive lines, thereby exposing the bottom surface of the conductive line. The first insulation layer has a portion having a width smaller than a width of the conductive line, and the portion is formed under the conductive line and covered with the spacer.

DETAILED DESCRIPTION OF EMBODIMENTS OF THE INVENTION

Figure 1:
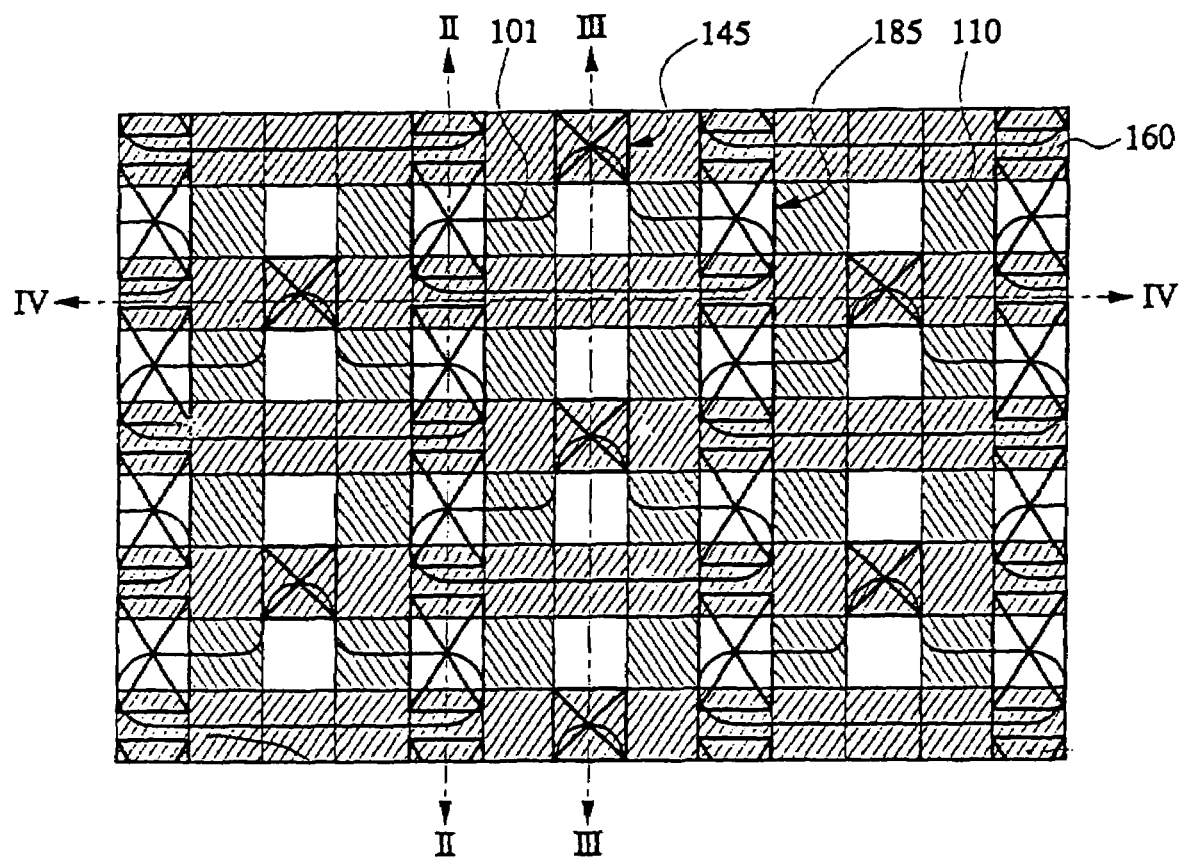
FIG. 1 is a plan view of a conventional integrated circuit device with a conductive line having a capacitor over bit line (COB) structure.
Figure 2A:
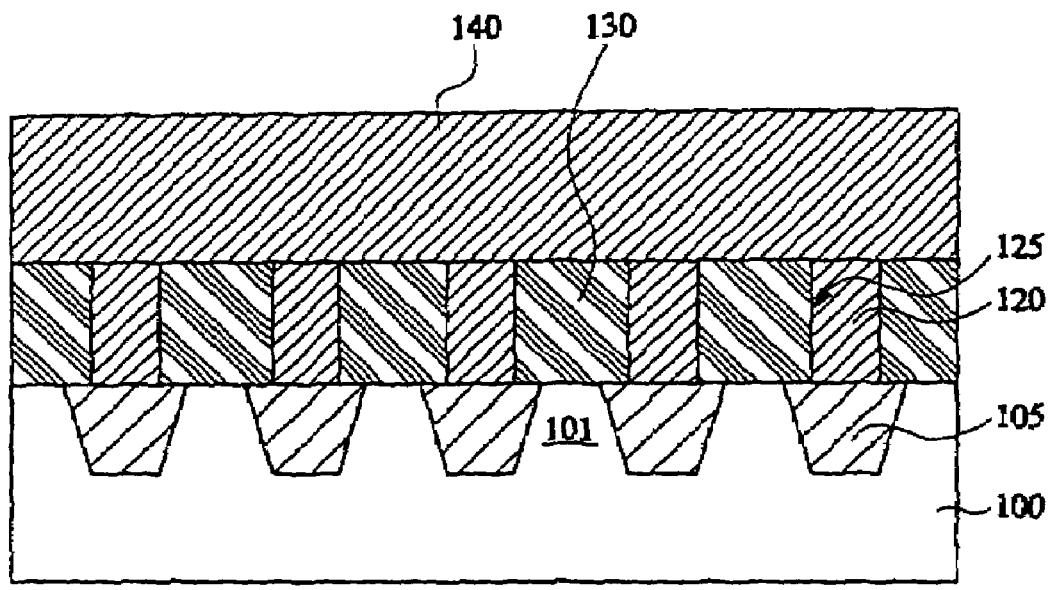
FIGS. 2A to 2E are cross-sectional views of a conventional method for fabricating the integrated circuit device, taken along a line II-II in FIG. 1.
Figure 2B:
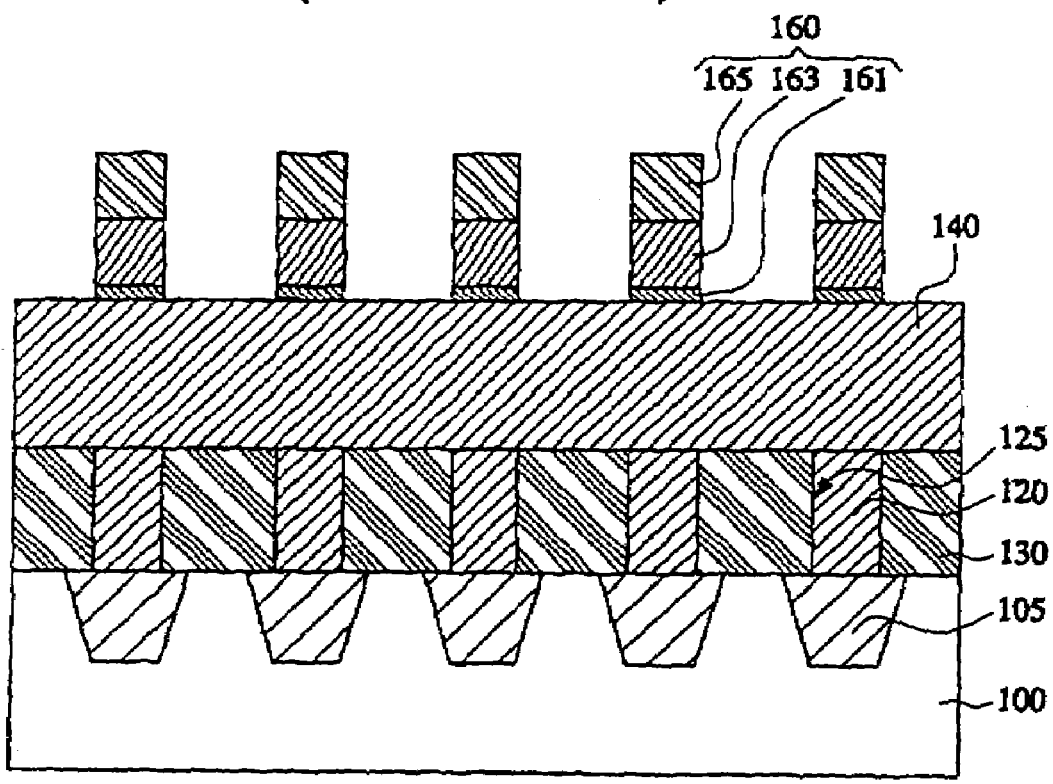
Figure 2C:
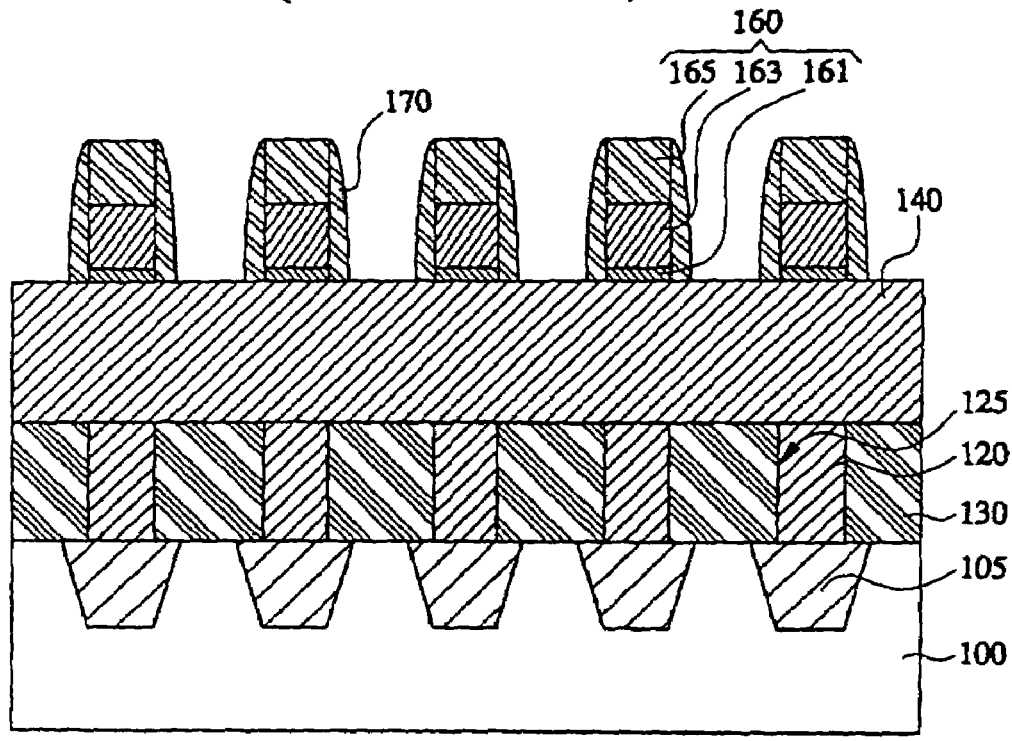
Figure 2D:
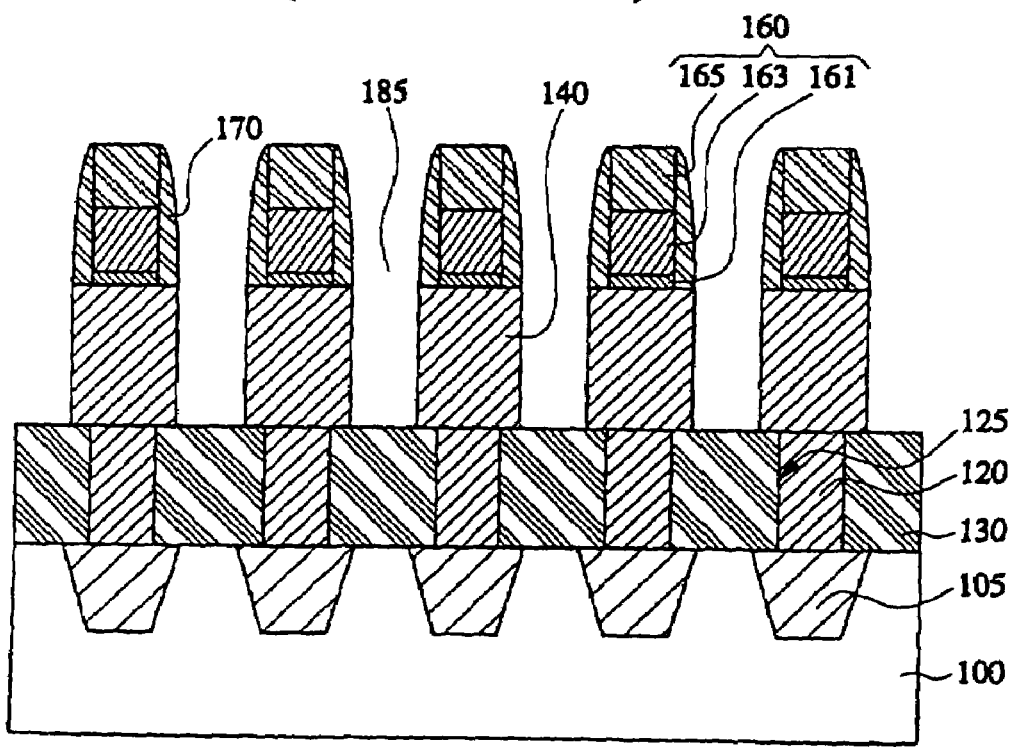
Figure 2E:
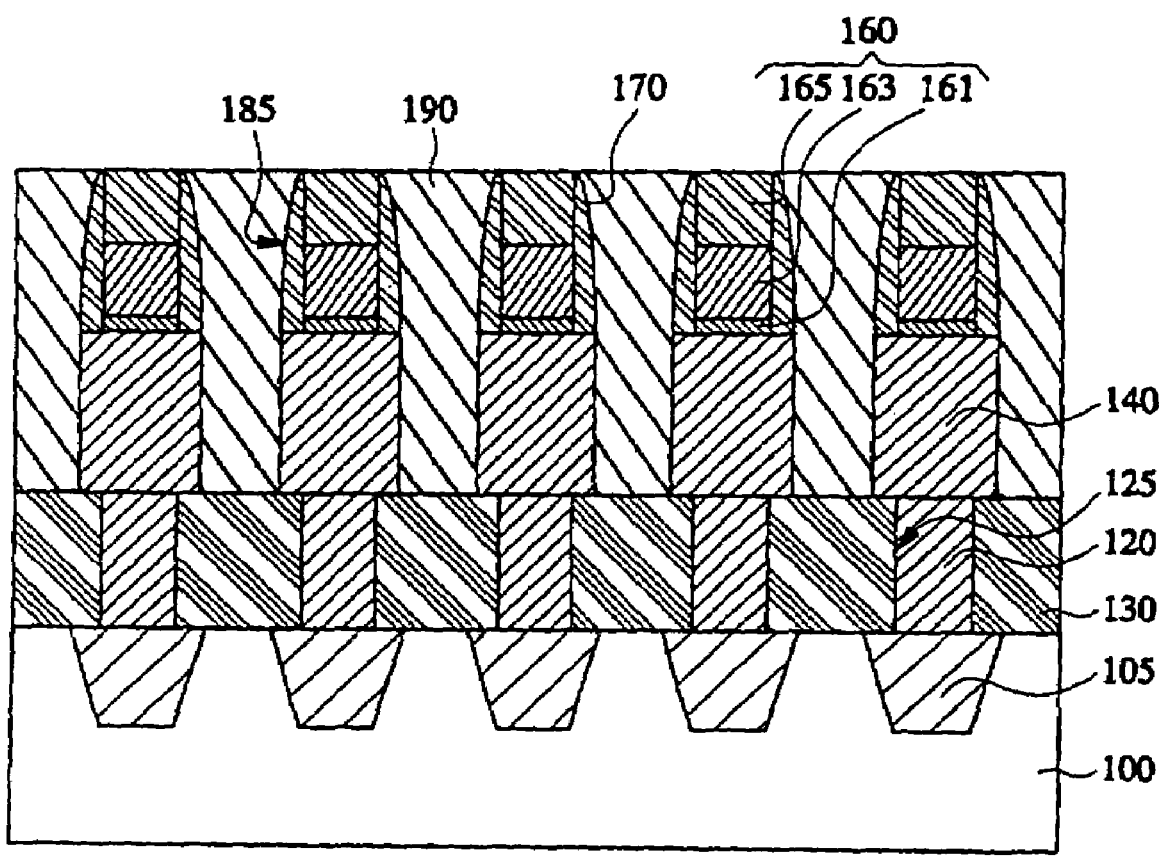
Figure 3A:
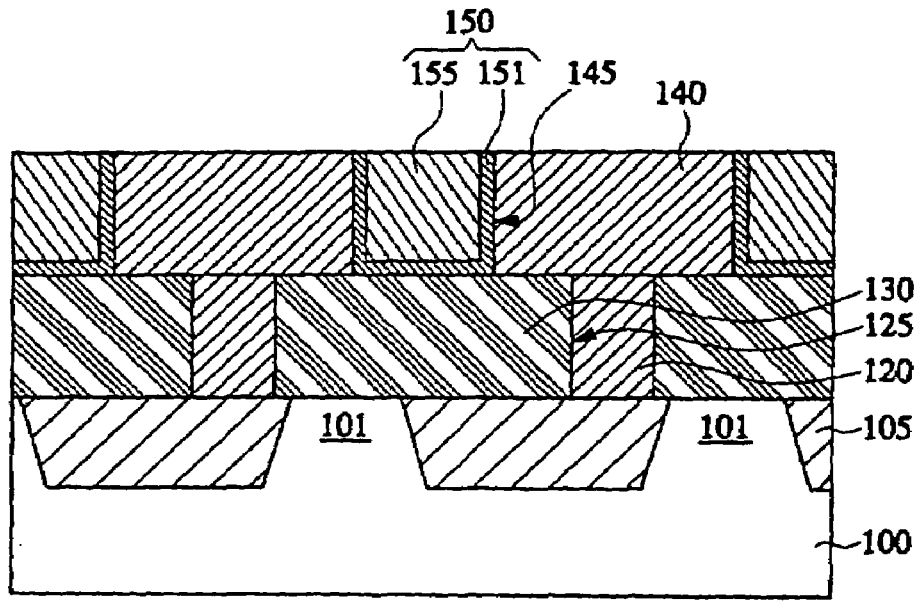
FIGS. 3A to 3E are cross-sectional views of a conventional method for fabricating the integrated circuit device, taken along a line III-III in FIG. 1.
Figure 3B:
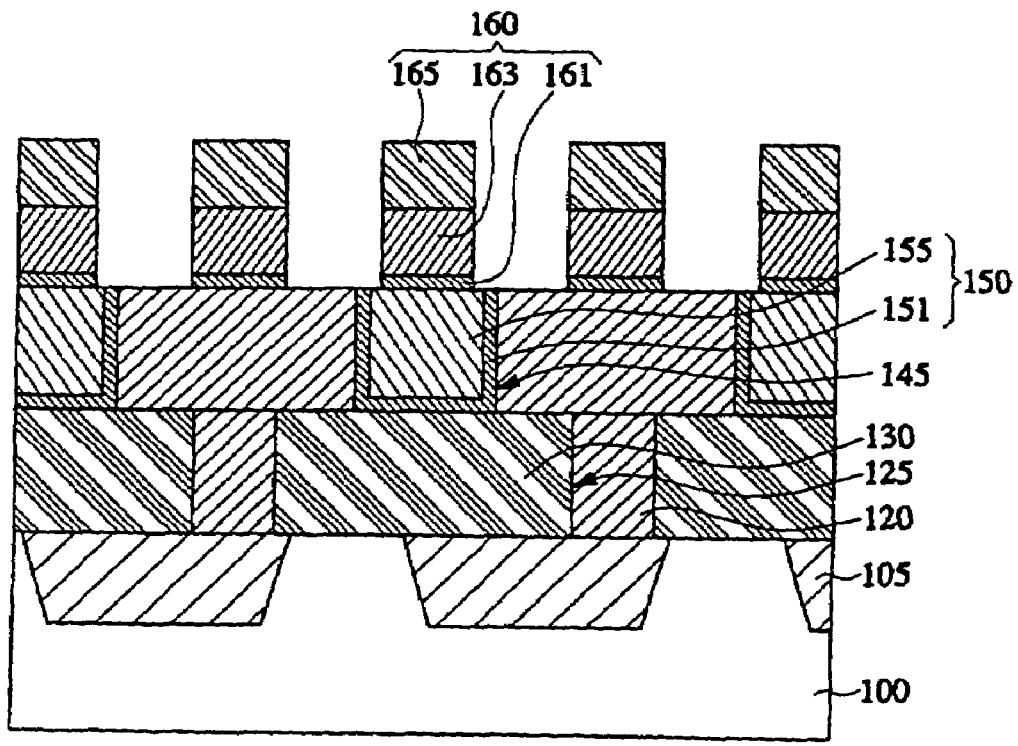
Figure 3C:
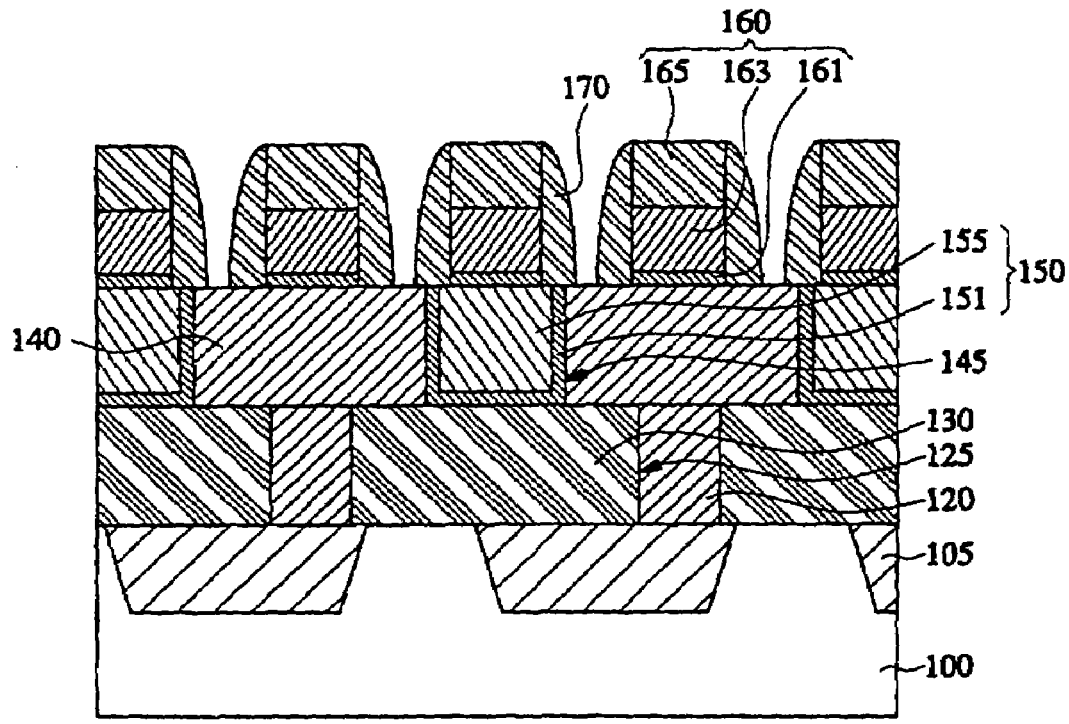
Figure 3D:
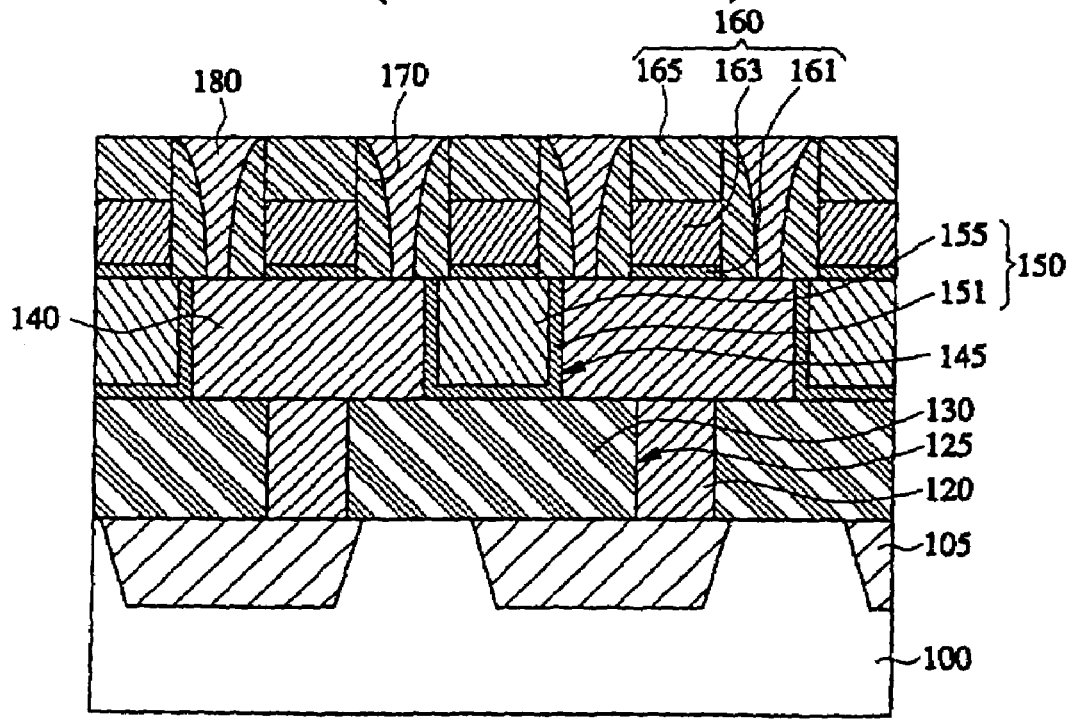
Figure 3E:
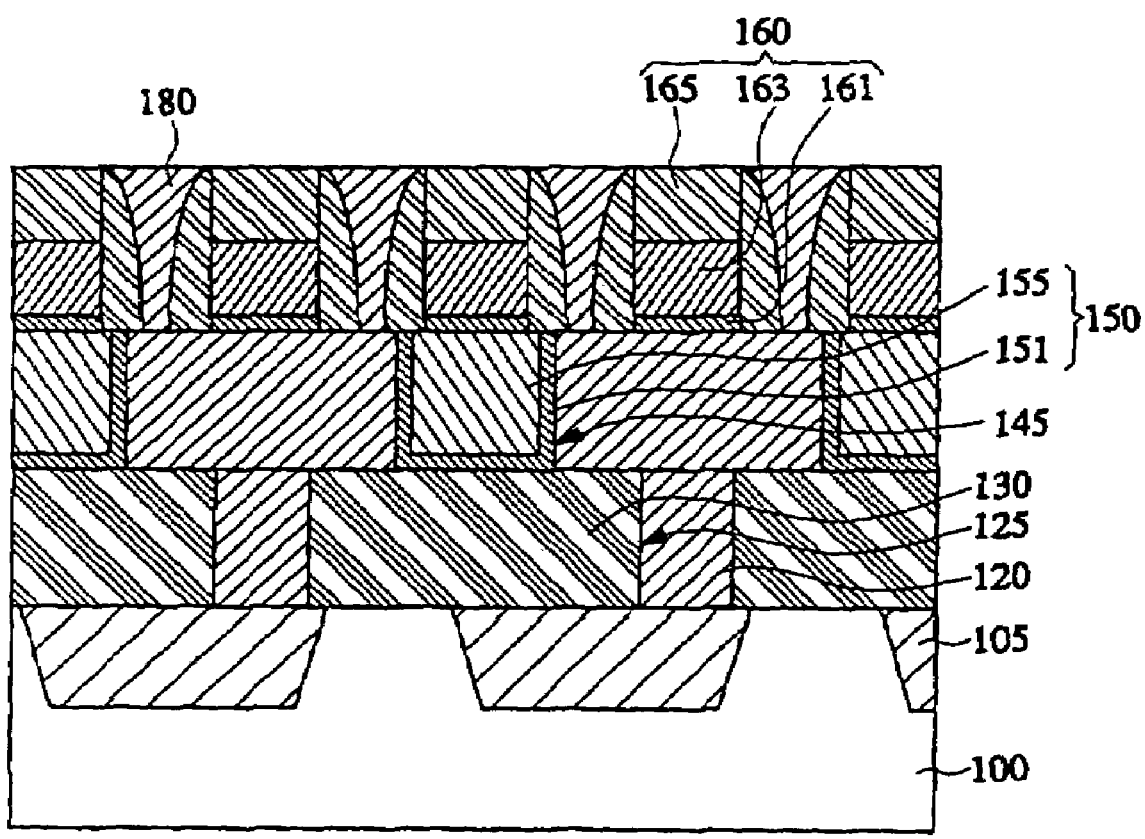
Figure 4:
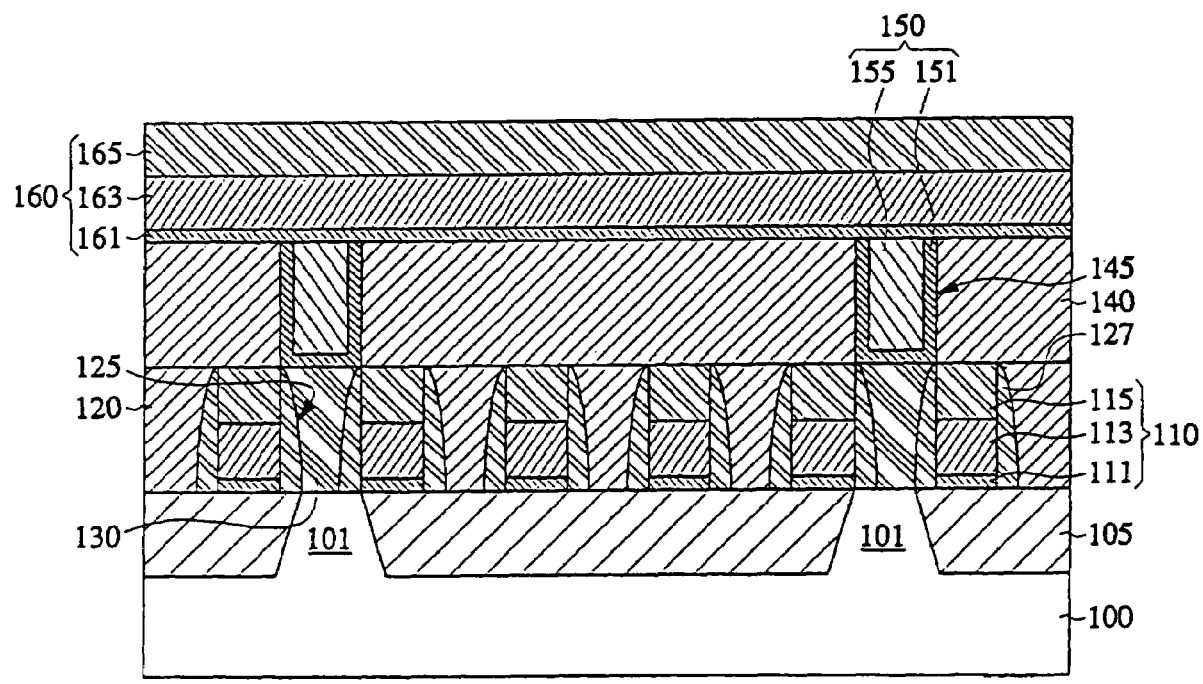
FIG. 4 is a cross-sectional view of the conventional integrated circuit device, taken along a line IV-IV of FIG. 1.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

It will be understood that embodiments of the present invention will be described below in connection with the fabrication of a bit line and a storage node of an integrated circuit memory device. However, embodiments of the present invention may be used to fabricate any conductive line and conductive contact on an integrated circuit substrate, whether or not the conductive line or contact is used in an integrated circuit memory device.

FIGS. 5A to 5E and FIGS. 6A to 6E are cross-sectional views of integrated circuit devices according to some embodiments of the present invention, during intermediate fabrication steps according to some embodiments of the invention. In particular, FIGS. 5A to 5E are cross-sectional views corresponding to sectional views taken along the line of II-II of FIG. 1 and FIGS. 6A to 6E are cross-sectional views corresponding to sectional views taken along the line III-III.

Figure 5A:
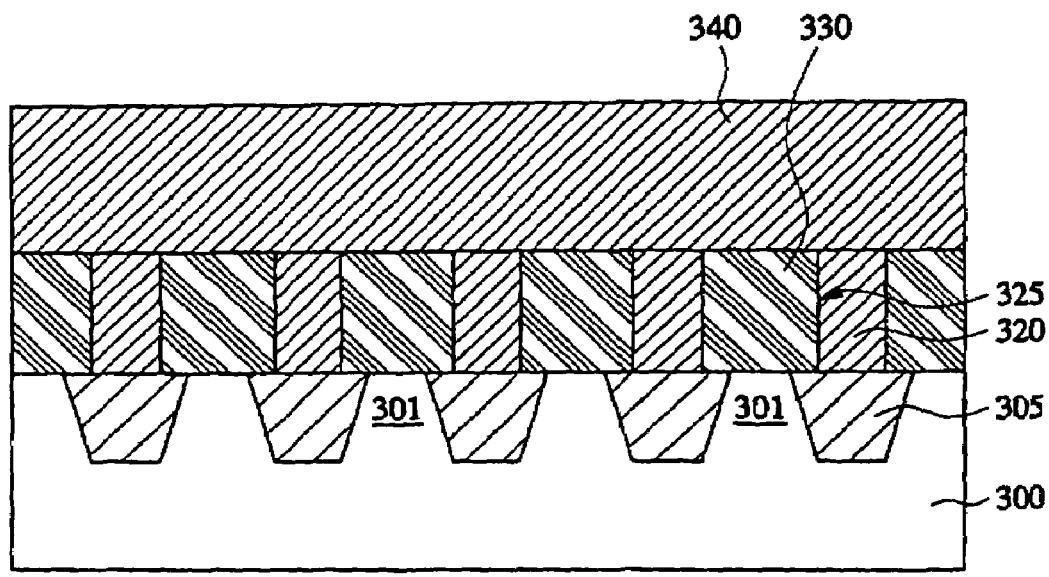
FIGS. 5A to 5E and 6A to 6E are cross-sectional views of integrated circuit devices according to embodiments of the present invention during intermediate fabrication steps of methods of forming a conductive line of an integrated circuit device, in accordance with embodiments of the present invention.
Figure 6A:
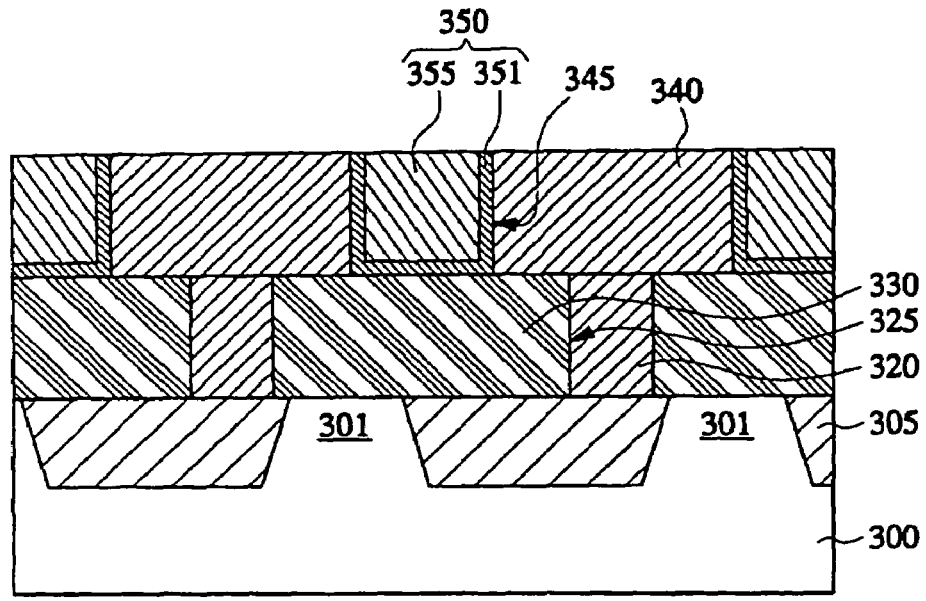

Referring to FIGS. 5A and 6A, there is provided an integrated circuit substrate, such as a semiconductor substrate 300, having an active region 301 and a field region in which a shallow trench isolation (STI) film 305 is formed by a conventional STI process.

A plurality of gates (not shown) are formed on the substrate 300, the gates being spaced apart from each other and extending along the same direction in parallel. Conventional gate structures may be formed in embodiments of the present invention.

A first interlayer insulation layer 320 is formed on the substrate 300 and a plurality of contact pads 330 are formed in the first interlayer insulation layer 320. The contact pads 330 are connected to impurity regions of a predetermined conductivity type (not shown) formed in the active area 301 of the substrate 300, respectively.

Then, a second interlayer insulation layer 340 is formed on the first interlayer insulation layer 320 and selectively etched to form a plurality of first contact holes, such as bit line contact holes 345, to respectively expose corresponding ones of the contact pads 330. The corresponding ones of the contact pads 330 are to be connected with a conductive line, such as a bit line, in a subsequent process.

A barrier metal layer 351 and a metal layer 355 are sequentially formed on the substrate 300 to fill the bit line contact holes 345. The barrier metal layer 351 and the metal layer 355 are etched through a CMP process to form a plurality of first contact pads, such as bit line contact pads 350, in the bit line contact holes 345 of the second interlayer insulation layer 340, respectively. The bit line contact pads 350 comprise the barrier metal layer 351 and the metal layer 355.

In some embodiments, the barrier metal layer 351 may be omitted. Therefore, the bit line contact pad 350 may be formed of the metal layer 355. The barrier metal layer 351 may be formed of Ti/TiN and the metal layer 355 may be formed of tungsten (W).

Figure 5B:
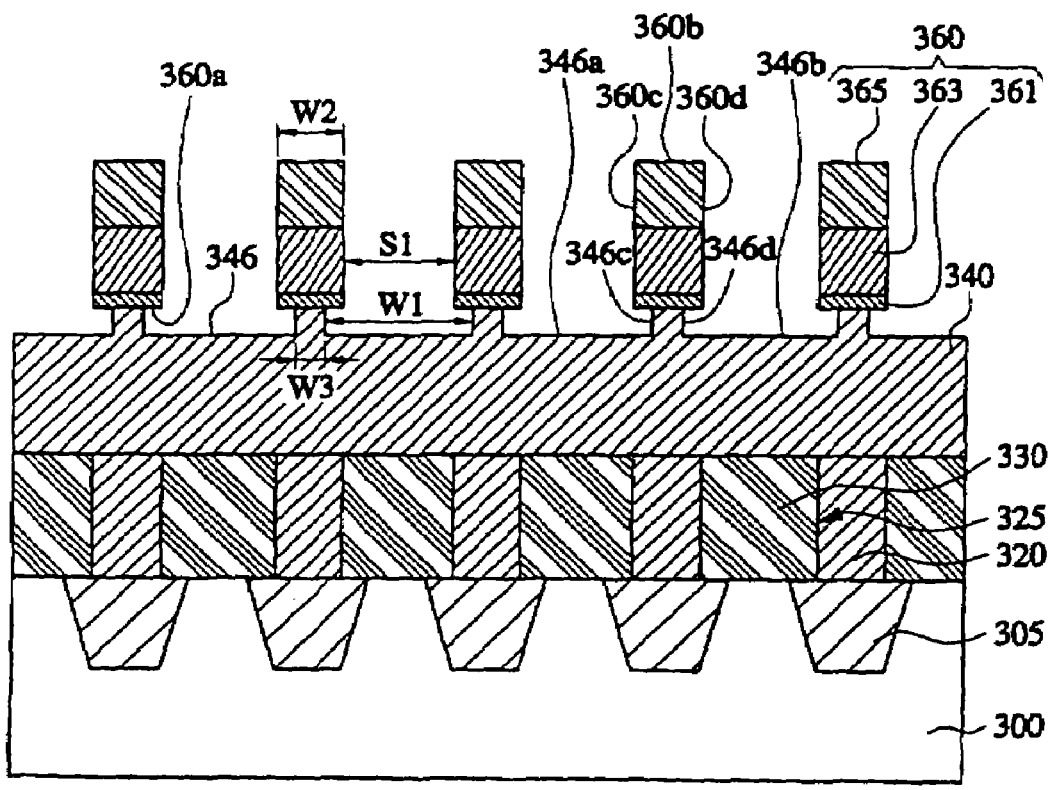
Figure 6B:
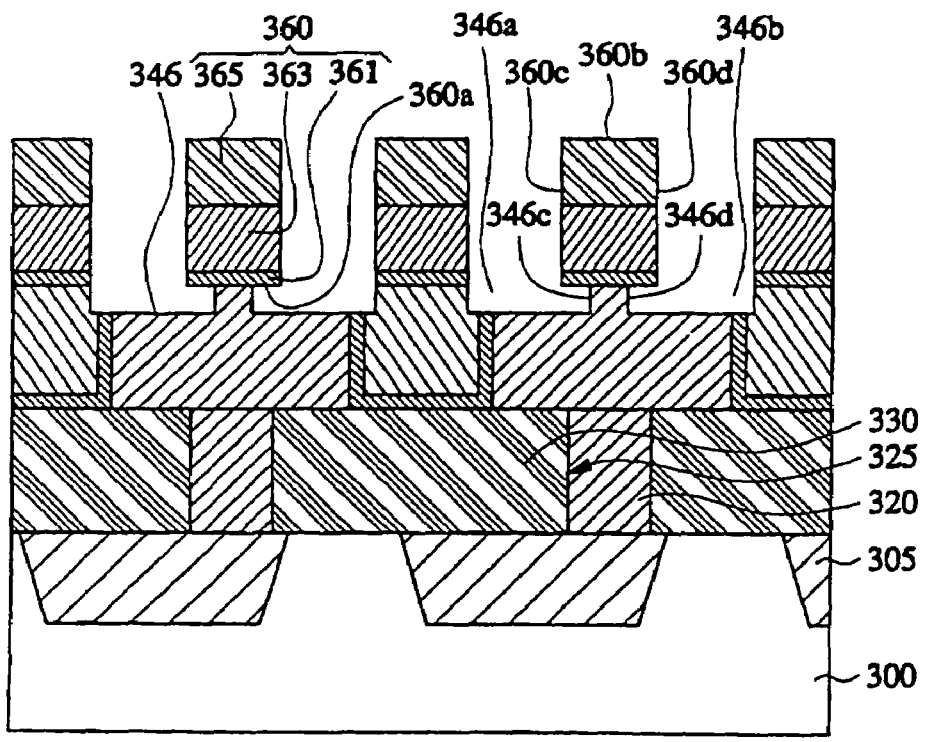

Referring to FIG. 5B and FIG. 6B, a barrier metal layer 361, a conductive material layer 363 and a capping layer 365 are sequentially formed on the second interlayer insulation layer 340 and patterned to form a plurality of conductive lines such as bit lines 360, each comprising the barrier metal line 361, the conductive material layer 363 and the capping layer 365. The bit lines 360 are extended along a direction perpendicular to the gates 310 and connected to the bit line contact pads 350 via the bit line contacts 345, respectively. As shown in FIG. 5B, each bit line 360 includes a bottom 360a adjacent the second interlayer insulation layer 340, a top 360b remote from the second interlayer insulating layer 340 and first and second sidewalls 360c, 360d, therebetween.

In some embodiments, the step of forming the bit line contact pad 350 may be omitted. In such case, the conductive material layer 363 and the capping layer 365 are formed in the bit line contact holes 345 and on the second interlayer insulation layer 340 and then patterned to form the bit lines 360, each comprising the conductive material layer 363 and the capping layer 365.

The barrier metal layer 361 may be formed of Ti/TiN and the conductive material layer 363 may be formed of tungsten (W). The capping layer 365 may be formed of a nitride layer.

Still referring to FIGS. 5B and 6B, a portion of the second interlayer insulation layer 340 which is exposed between the bit lines 360 is etched using the bit lines 360 as an etch mask by a dry etching process and/or a wet etching process to form a plurality of trenches 346 in the second interlayer insulation layer 340. During the etching process, a portion of the second interlayer insulation layer 340 beneath the bit line 360 is undercut to form the trench 346, which is formed to be elongated in the bit line direction and which exposes a portion of bottom surfaces 360a of the bit lines 360. Thus, the trench 346 has a width W1 greater than a distance S1 between adjacent bit lines 360, and the second interlayer insulation layer 340 has a portion beneath the bit line 360, having a width W3 smaller than a width W2 of the bit line 360. Stated differently, the second interlayer insulating layer 340 includes therein a first trench 346a that extends beneath the bottom 360a adjacent the first sidewall 360c, to define a first trench sidewall 346c. A second trench 346b extends beneath the bottom 360a adjacent the second sidewall 360d to define a second trench sidewall 346d.

Figure 5C:
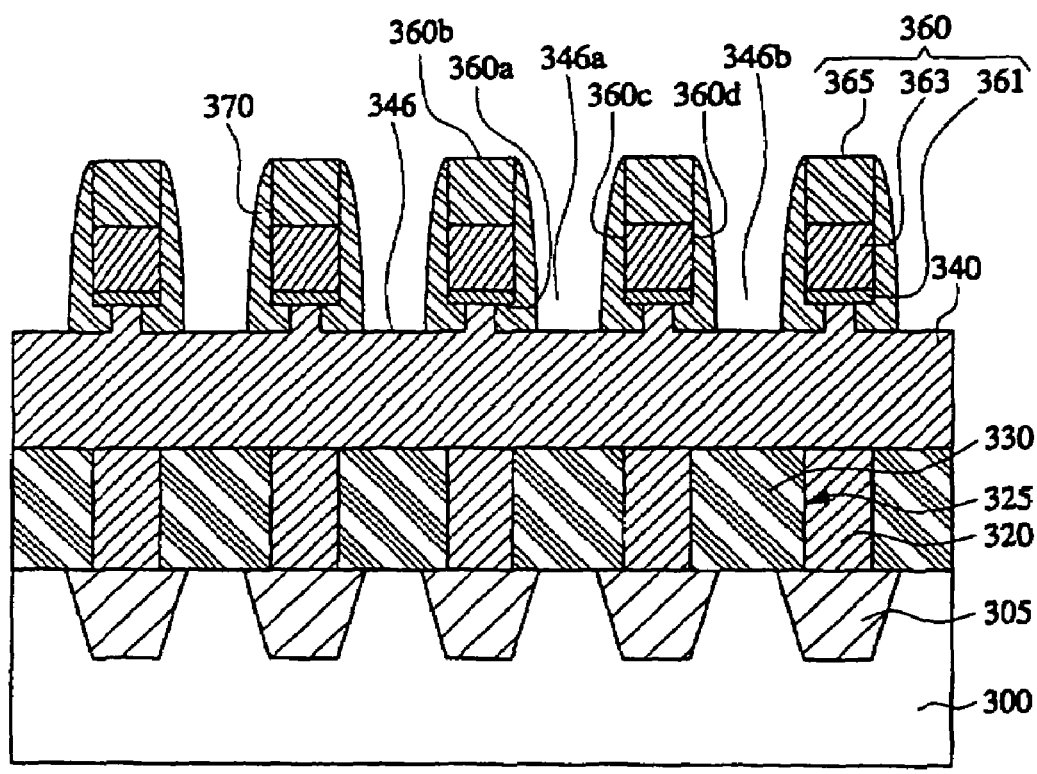
Figure 6C:
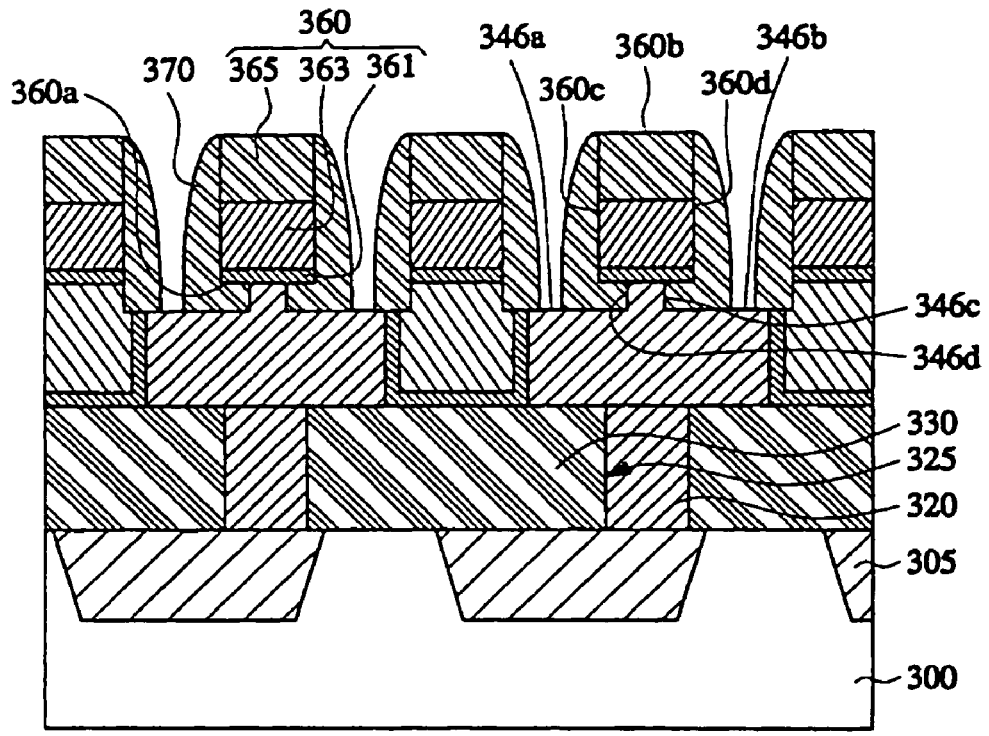

Referring to FIG. 5C and FIG. 6C, an insulation layer is formed on the surface of the second interlayer insulation layer 340 including the bit lines 360, and then etched back to form bit line spacers 370 on sidewalls of the bit lines 360. The bit line spacers 370 are formed of a material having etching selectivity to the second and third interlayer insulation layers 340 and 380, for example a nitride layer. The bit line spacers 370 may also be formed of an oxide layer having etching selectivity to the second and third interlayer insulation layers 340 and 380. The bit line spacers 370 are formed not only on the sidewalls 360c, 360d of the bit lines 360 but also on sidewalls 346c, 346d of the trenches 346a, 346b in the interlayer insulation layer 340, thereby covering an exposed portion of the bottom 360a of the bit line 360. Stated differently, the insulating spacer 370 extends from the first sidewall 360c into the first trench 346a to the first trench sidewall 346c, and also extends from the second sidewall 360d into the second trench 346b to the second trench sidewall 346d. Thus, the insulating spacer 370 extends along the first and second sidewalls 360c, 360d and also extends along at least a portion of the bottom 360a between the conductive line 360 and the insulating layer 340.

Accordingly, in some embodiments, the capping layer 365 comprising a nitride layer is formed on the upper surface of the bit line 360 and the bit line spacer 370 is formed on the sidewall and the bottom surface of the bit line 360 so that each bit line 360 is surrounded by insulation material to reduce or prevent leakage current from the bottom edge of the bit line 360.

Figure 5D:
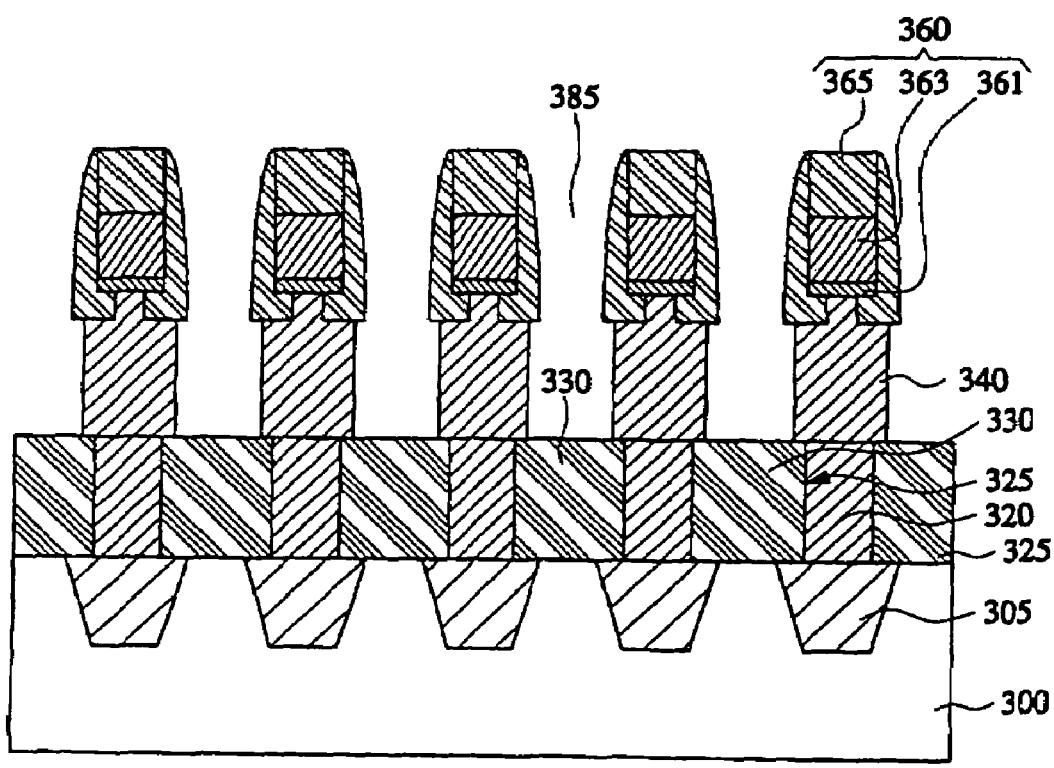
Figure 6D:
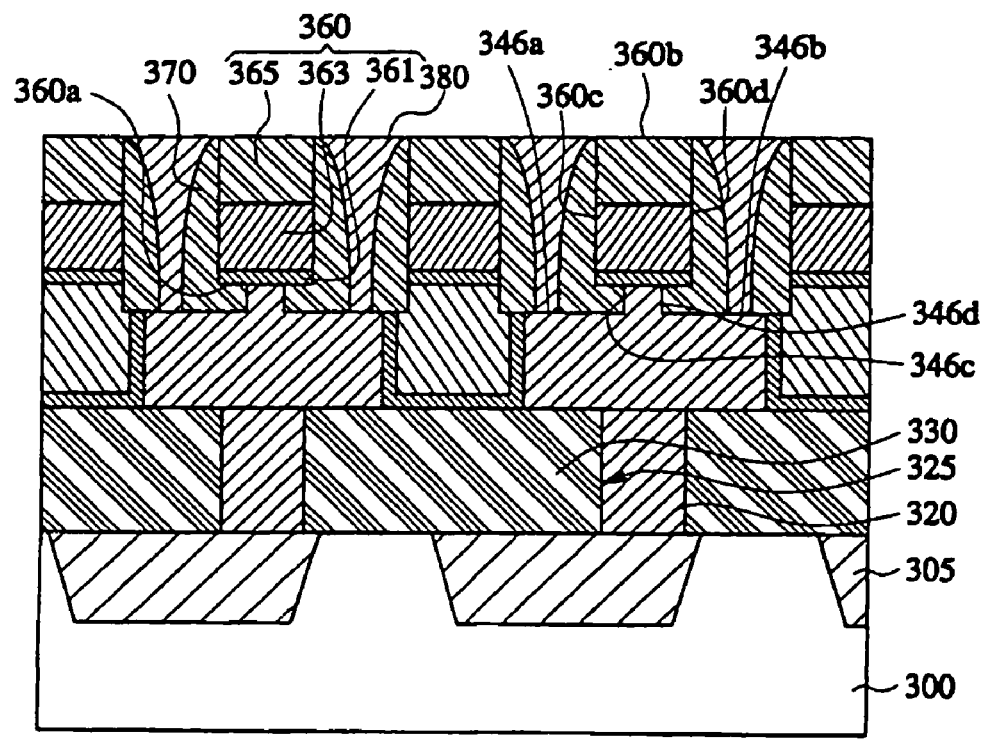

Referring to FIG. 5D and FIG. 6D, a third interlayer insulation layer 380 is formed on the second interlayer insulation layer 340 and on the bit lines 360. Then, the second interlayer insulation layer 340 and the third interlayer insulation layer 380 are etched to form second contact holes such as storage node contact holes 385 exposing corresponding ones of the contact pads 330 which, in some embodiments, are to be connected with a storage node of a capacitor in a following process. The first to third interlayer insulation layers 320, 340 and 380 are formed of boron phosphorous silicate glass (BPSG), high density plasma (HDP) oxide, or TOSZ™ oxide (an oxide formed by using an oligomer polysilizane marketed by Clariant Corporation). Further, first to third interlayer insulation layers 320, 340 and 380 may be formed of other oxides not limited to the BPSQ the HDP oxide, the HDP oxide, or TOSZ™ oxide.

In accordance with some embodiments of the present invention, during etching the second and third interlayer insulation layers 340 and 380 to form the storage node contact holes 385, etching margin can be enhanced because the bit line 360 is covered with the bit line insulation spacers, formed of a material having etching selectivity to the second and third interlayer insulation layers 340 and 380, at the bottom surface 360a thereof. That is, by forming the storage node contact hole 385 to expose a portion of the bit line spacer 370 which covers the bottom surface 360a of the bit line 360, a contact area of the storage node contact hole 385 can be enlarged. Accordingly, it is possible to provide not only the etching margin to form the storage node contact but also to enhance insulation reliability between the bit line and the storage node contact pad and further to reduce the contact resistance.

Figure 5E:
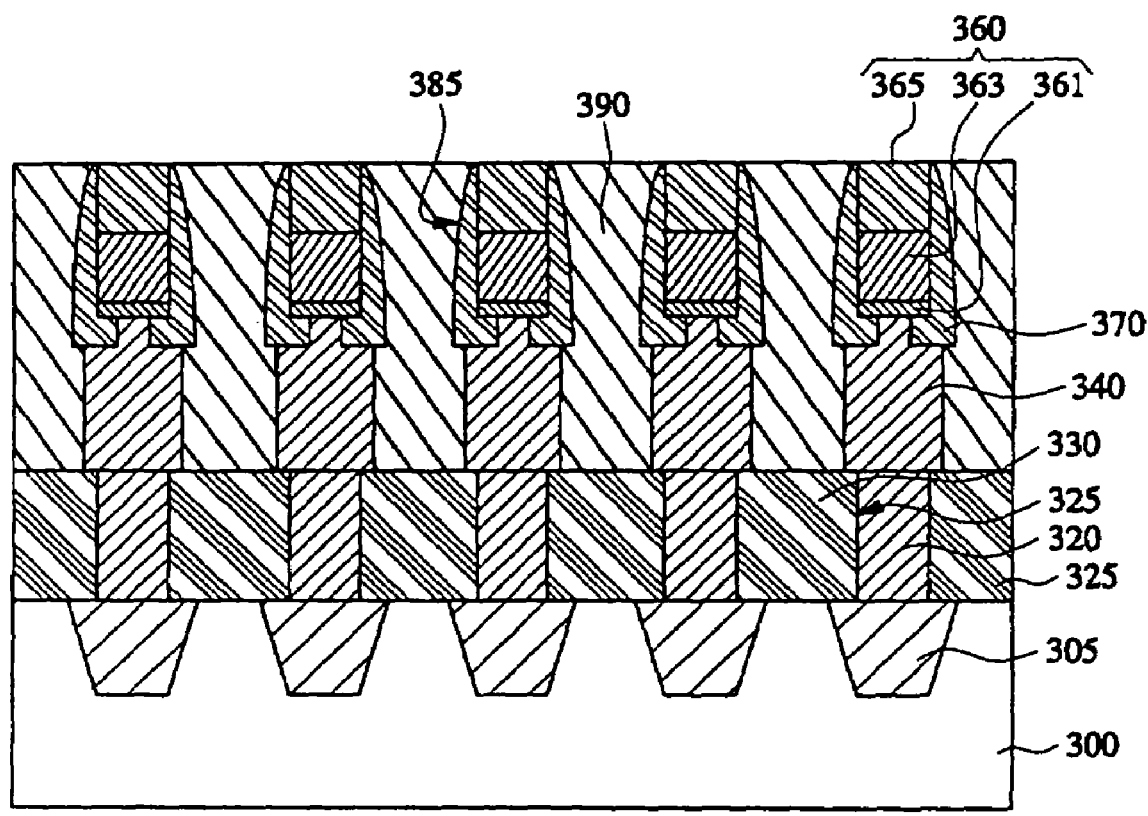
Figure 6E:
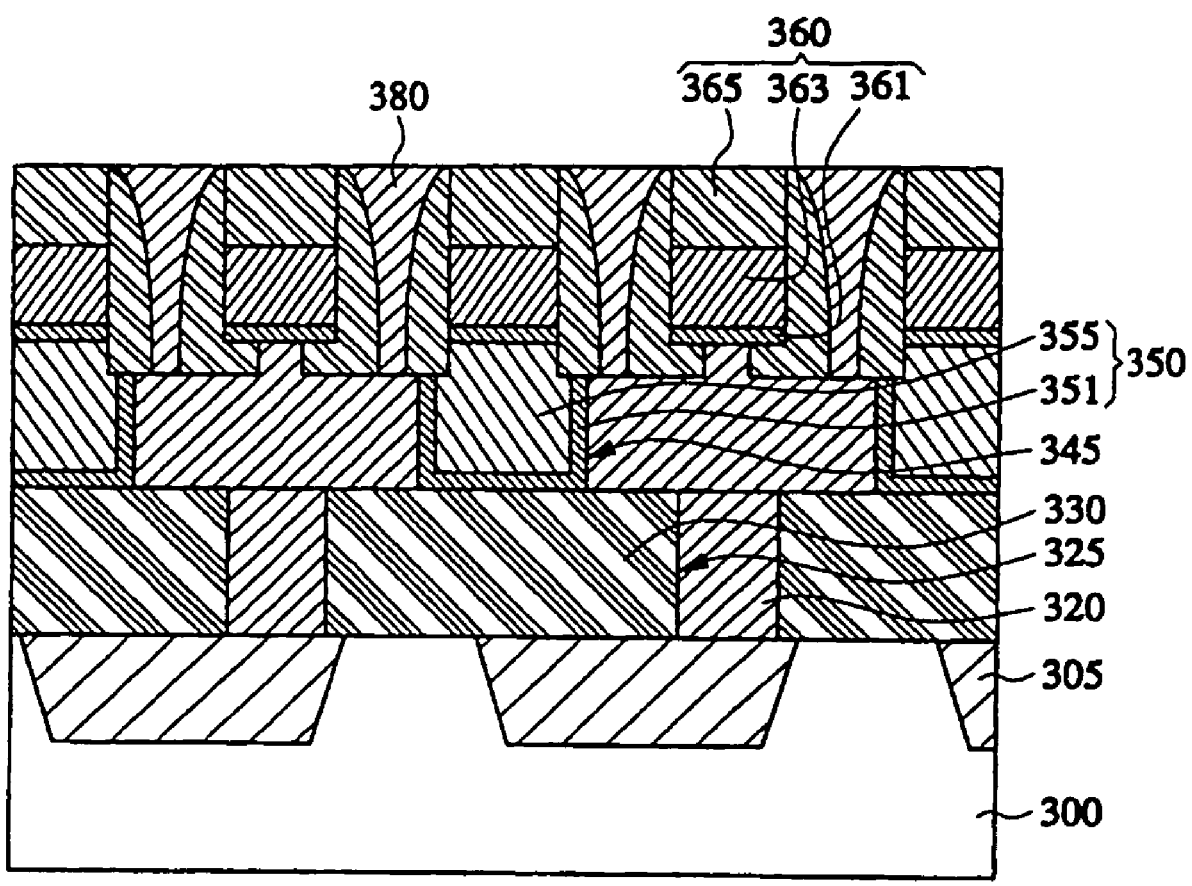

Referring to FIG. 5E and FIG. 6E, a polysilicon layer is formed on the substrate 300 in FIG. 5D and FIG. 6D. Then, the polysilicon layer is etched back by the CMP process for node separation to form storage node contact pads 390. The storage node contact pads 390 are connected to the contact pads 330 via the storage node contacts 385, respectively.

Then, for a Dynamic Random Access Memory (DRAM), a dielectric layer (not shown) and an upper plate (not shown) are formed on the storage node contact pads 390 to fabricate capacitors.

According to some embodiments of the present invention, the bottom surface 360a and sidewalls 360c, 360d of the conductive line 360 are covered with the spacers formed of a material having etching selectivity with respect to the interlayer insulation layer to reduce or prevent a leakage current from the bottom edge of the bit line, which can improve insulation reliability between the bit line and the storage node contact pad. In addition, some embodiments of the present invention can provide not only the etching margin to form the storage node contact but also can provide insulation reliability between the bit line and the storage node contact pad and can further reduce the contact resistance by allowing an increase in the contact area of the storage node contact.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit device comprising:
   an integrated circuit substrate;
   an insulation layer on the integrated circuit substrate including a first portion adjacent the substrate and a second portion protruding therefrom remote from the substrate, wherein the second portion is narrower than the first portion;
   a conductive line on the insulation layer, the conductive line including a bottom on the protruding second portion of the insulation layer, a top remote from the insulation layer and first and second sidewalls therebetween; and
   a spacer that extends along the first and second sidewalls of the conductive line and along at least a portion of the bottom between the conductive line and the first portion of the insulation layer adjacent the second portion of the insulation layer such that the spacer is bifurcated by the protruding second portion of the insulation layer.

2. An integrated circuit device according to claim 1:
   wherein the insulation layer includes therein a first trench defined by the first and second portions that extends beneath the bottom adjacent the first sidewall to define a first trench sidewall and a second trench that extends beneath the bottom adjacent the second sidewall to define a second trench sidewall; and
   wherein the spacer includes a first portion in the first trench and a second portion in the second trench, wherein the first portion of the spacer extends from the first sidewall into the first trench to the first trench sidewall, and wherein the second portion of the spacer extends from the second sidewall into the second trench to the second trench sidewall such that the protruding second portion of the insulating layer separates the first and second portions of the spacer.

3. An integrated circuit device according to claim 1 further comprising a contact pad on the spacer, remote from the conductive line.

4. A device according to claim 1, wherein the bottom of the conductive line is directly on the protruding second portion of the insulation layer.

5. A device according to claim 4, wherein the conductive line comprises a barrier metal layer on the second portion of the insulation layer, a conductive material layer on the barrier metal layer, and a capping layer on the conductive material layer.

6. An integrated circuit device, comprising:
   an integrated circuit substrate;
   an insulation layer on the substrate including a first portion adjacent the substrate and a second portion protruding therefrom remote from the substrate, wherein the second portion is narrower than the first portion;
   a contact pad in the insulation layer;
   a conductive line on the second portion of the insulation layer and connected to the contact pad; and
   a spacer on the conductive line;
   wherein the spacer extends on a sidewall of the conductive line and between the conductive line and the first portion of the insulation layer and adjacent the second portion of the insulation layer, such that the spacer covers an exposed bottom surface of the conductive line and is bifurcated by the protruding second portion of the insulation layer.

7. The device according to claim 6, wherein the spacer comprises an insulation material having etching selectivity to the insulation layer.

8. An integrated circuit device, comprising:
   an integrated circuit substrate;
   a first insulation layer on the substrate including first portions adjacent the substrate, second portions protruding from the first portions remote from the substrate that are narrower than the first portions, and including a plurality of first contacts to expose the substrate;
   a plurality of conductive lines in the first contacts and on respective second portions of the first insulation layer, and spaced apart from each other;
   a plurality of spacers, a respective one of which is on a sidewall of a respective conductive line;
   a second insulation layer on the conductive lines and the first insulation layer;
   a second contact in the first and second insulation layers to expose a portion of the substrate; and
   a contact pad in the second contact;
   wherein the first insulation layer includes a plurality of trenches defined by respective first and second portions exposing bottom surfaces of the conductive lines adjacent the first insulation layer, and wherein a respective spacer is on a respective sidewall of the conductive line and on a respective sidewall of a trench adjacent thereto between the conductive line and the first portion of the first insulation layer and adjacent the second portion of the first insulation layer, such that the respective spacer covers an exposed bottom surface of the conductive line and is bifurcated by a respective protruding second portion of the first insulation layer.

9. A device according to claim 8, wherein the spacer comprises an insulation material having etching selectivity to the first and second insulation layers.

10. A device according to claim 8, wherein the trenches in the first insulation layer have a width greater than a distance between adjacent conductive lines, thereby exposing the bottom surfaces of the conductive lines.

11. A device according to claim 8, wherein the second portions of the first insulation layer are narrower than respective conductive lines thereon, and wherein the second portions are located directly beneath the respective conductive lines and adjacent respective spacers.

12. A device according to claim 8, wherein the conductive lines comprise a bit line contact pad in the first insulation layer, a conductive material layer on the bit line contact pad and a capping layer on the conductive material layer.

13. A device according to claim 8, wherein the conductive lines comprise a conductive material layer on the first insulation layer, and a capping layer on the conductive material layer.

* * * * *